(12) United States Patent
Carpenter et al.

(10) Patent No.: US 6,810,583 B2
(45) Date of Patent: Nov. 2, 2004

(54) COUPLING OF CONDUCTIVE VIAS TO COMPLEX POWER-SIGNAL SUBSTRUCTURES

(75) Inventors: Karen Carpenter, Johnson City, NY (US); Voya R. Markovich, Endwell, NY (US); David L. Thomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 221 days.

(21) Appl. No.: 09/924,204

(22) Filed: Aug. 7, 2001

(65) Prior Publication Data

US 2003/0029636 A1 Feb. 13, 2003

(51) Int. Cl.[7] .................................................. H01K 3/10
(52) U.S. Cl. ............................. 29/852; 29/846; 29/593
(58) Field of Search ........................... 29/846, 852, 593

(56) References Cited

U.S. PATENT DOCUMENTS

| | | | |
|---|---|---|---|
| 5,199,163 A | | 4/1993 | Ehrenberg et al. |
| 5,276,955 A | * | 1/1994 | Noddin et al. ............... 29/593 |
| 5,329,695 A | | 7/1994 | Traskos et al. |
| 5,337,466 A | | 8/1994 | Ishida |
| 5,419,038 A | | 5/1995 | Wang et al. |
| 5,440,805 A | | 8/1995 | Daigle et al. |
| 5,557,844 A | | 9/1996 | Bhatt et al. |
| 5,558,928 A | * | 9/1996 | DiStefano et al. ........... 428/209 |
| 5,841,099 A | | 11/1998 | Owen et al. |
| 6,163,957 A | | 12/2000 | Jiang et al. |
| 6,181,004 B1 | * | 1/2001 | Koontz et al. .............. 257/691 |

* cited by examiner

Primary Examiner—Richard Chang
(74) Attorney, Agent, or Firm—Schmeiser, Olsen & Watts; William H. Steinberg

(57) ABSTRACT

An electrical structure that includes a complex power-signal (CPS) substructure. The CPS substructure is formed and tested to determine whether the CPS substructure satisfies electrical performance acceptance requirements. The testing includes testing for electrical shorts, electrical opens, erroneous impedances, and electrical signal delay. If the CPS substructure passes the tests, then a dielectric-metallic (DM) laminate is formed on an external surface of the CPS substructure. The DM laminate includes an alternating sequence of an equal number N of dielectric layers and metallic layers such that a first dielectric layer of the N dielectric layers is formed on an external surface of the CPS substructure. N is at least 2. A multilevel conductive via is formed through the DM laminate and is electrically coupled to a metal layer of the CPS substructure.

40 Claims, 6 Drawing Sheets

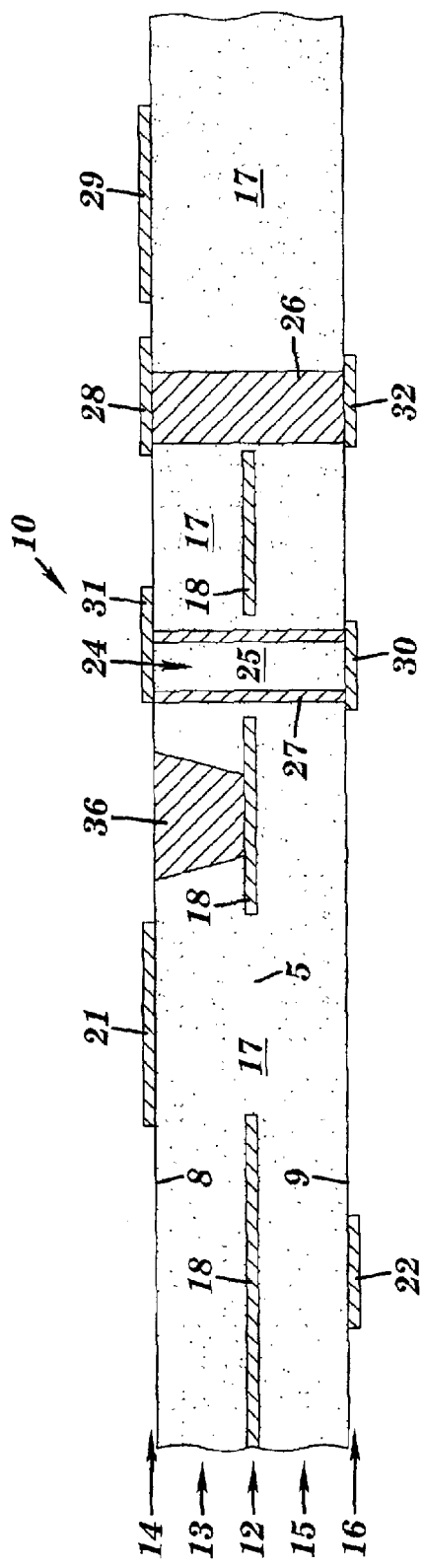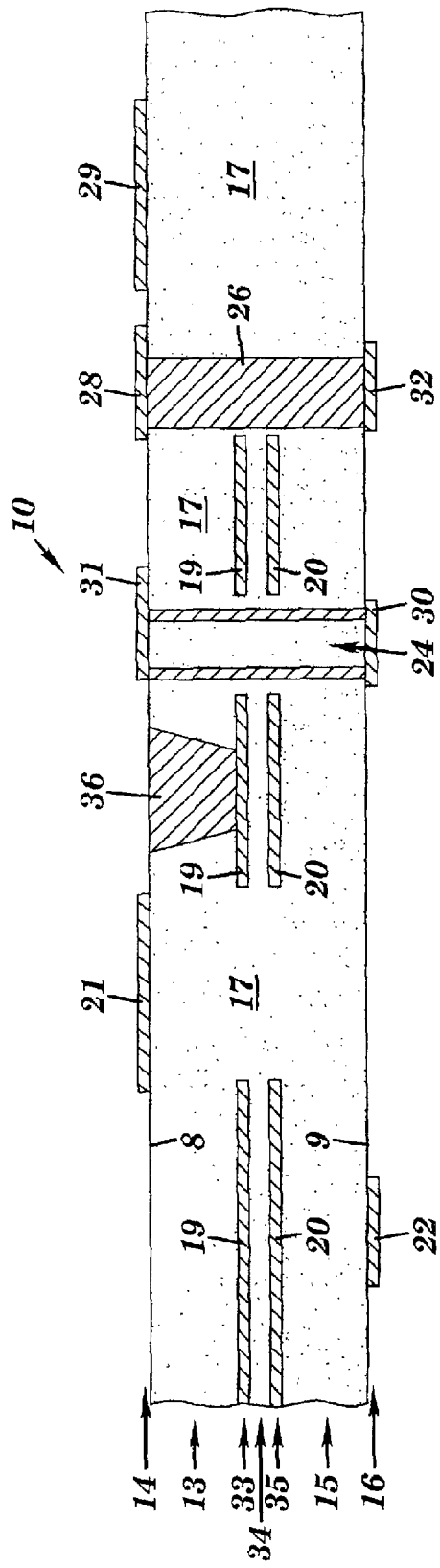

COUPLING OF CONDUCTIVE VIAS TO COMPLEX POWER-SIGNAL SUBSTRUCTURES

BACKGROUND OF THE INVENTION

1. Technical Field

The present invention relates to an electrical laminate structure, and associated method of formation, having multilevel conductive vias that are electrically coupled to circuit features of the electrical laminate structure.

2. Related Art

A capability for increasing the yield of fabricated printed circuit structures would lower costs and improve profitability. Additionally, providing additional ways of electrically coupling circuit features of a printed circuit structure would improve design flexibility and efficiency.

Accordingly, there is a need for increasing the yield of fabricated printed circuit structures. Additionally, there is a need for providing additional ways of electrically coupling circuit features of a printed circuit structure.

SUMMARY OF THE INVENTION

The present invention provides a method of forming an electrical structure, comprising:

forming a complex power-signal (CPS) substructure;

testing an electrical performance of the CPS substructure to determine whether the CPS substructure satisfies electrical performance acceptance requirements, wherein the testing includes testing for at least one of electrical integrity and electrical signal delay, and wherein the testing for electrical integrity includes testing for at least one of an electrical short, an electrical open, and an erroneous impedance; and if the testing determines that the CPS substructure satisfies the electrical performance acceptance requirements, then forming a dielectric-metallic (DM) laminate on a first external surface of the CPS substructure including forming a first multilevel conductive via through the DM laminate, wherein the DM laminate includes an alternating sequence of an equal number N of dielectric layers and metallic layers such that a first dielectric layer of the N dielectric layers is formed on the first external surface of the CPS substructure, wherein N is at least 2, and wherein the multilevel conductive via is electrically coupled to a first metal layer of the CPS substructure.

The present invention provides an electrical structure, comprising:

a complex power-signal (CPS) substructure;

a dielectric-metallic (DM) laminate that includes an alternating sequence of an equal number N of dielectric layers and metallic layers such that a first dielectric layer of the N dielectric layers is formed on a first external surface of the CPS substructure, wherein N is at least 2; and a first multilevel conductive via through the DM laminate, wherein the first multilevel conductive via is electrically coupled to a first metal layer of the CPS substructure.

The present invention provides an electrical structure, comprising:

a complex power-signal (CPS) substructure that has passed an electrical performance acceptance test for at least one of an electrical integrity and electrical signal delay, wherein the test for electrical integrity includes a test for at least one of an electrical short, an electrical open, and an erroneous impedance;

a dielectric-metallic (DM) laminate that includes an alternating sequence of an equal number N of dielectric layers and metallic layers such that a first dielectric layer of the N dielectric layers is formed on a first external surface of the CPS substructure, wherein N is at least 2; and a first multilevel conductive via through the DM laminate, wherein the first multilevel conductive via is electrically coupled to a first metal layer of the CPS substructure.

The present invention facilitates increasing the yield of fabricated electrical laminate structures (e.g., printed circuit structures). Additionally, the present invention provides additional ways of electrically coupling circuit features of an electrical laminate structure.

BRIEF DESCRIPTION OF THE DRAWINGS

FIG. 1 depicts a front cross-sectional view of a single complex power-signal (CPS) substructure, in accordance with embodiments of the present invention.

FIG. 2 depicts a front cross-sectional view of a double complex power-signal (CPS) substructure, in accordance with embodiments of the present invention.

DETAILED DESCRIPTION OF THE INVENTION

Figure 3:
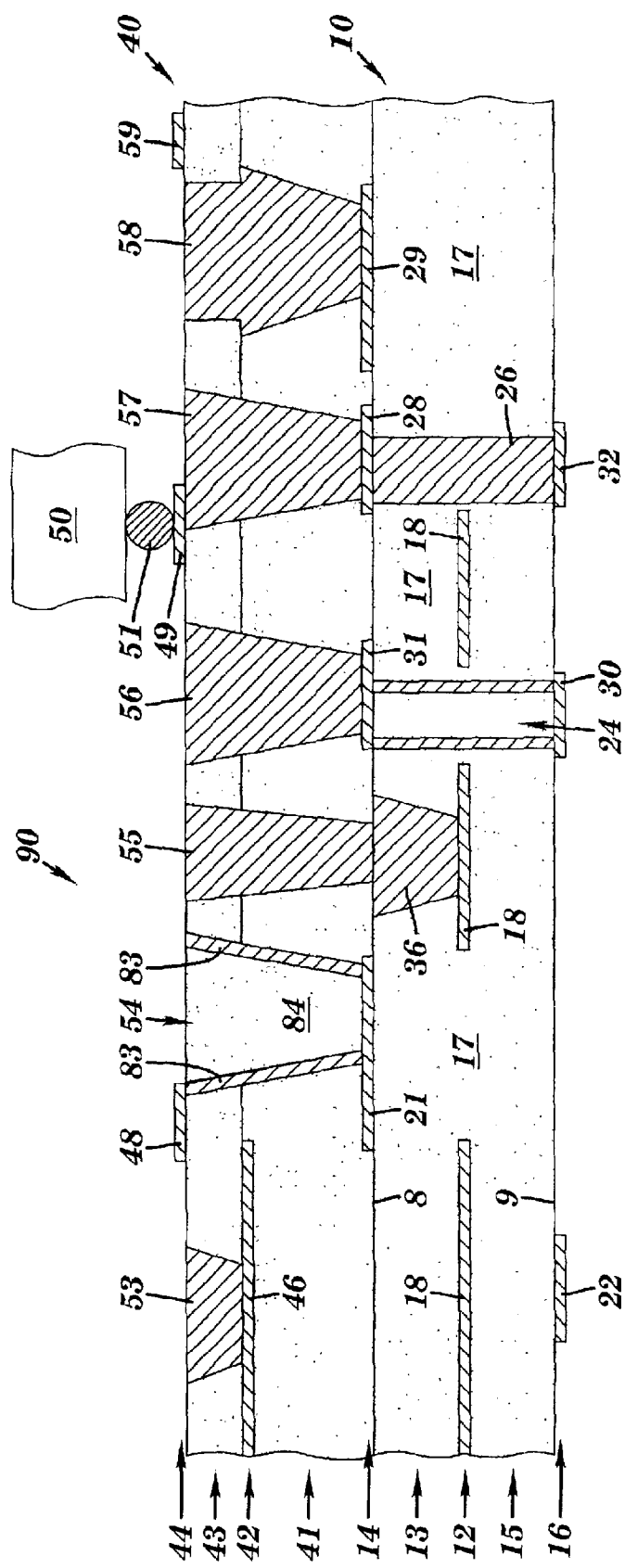
FIG. 3 depicts a dielectric-metallic (DM) laminate formed on the CPS substructure of FIG. 1, wherein the DM laminate includes simple, stacked and deep vias, in accordance with embodiments of the present invention.

FIG. 1 illustrates a front cross-sectional view of a single complex power-signal (CPS) substructure 10, in accordance with embodiments of the present invention. The single CPS substructure 10 comprises: a power plane 12 sandwiched between dielectric layers 13 and 15; and metal layers 14 and 16 on the dielectric layers 13 and 15, respectively. A power plane is a continuous electrically conductive metal sheet (e.g., a copper sheet) with one or more holes therein (e.g., the hole 5 in the power plane 12). The dielectric layers 13 and 15 comprise a dielectric material 17 such as an organic dielectric material (e.g., polytetrafluoroethylene (PTFE), epoxy-fiberglass, polyimide epoxy, etc.). The metal layers 14 and 16 may each be a signal plane or a power plane. A signal plane comprises one or more electrically conductive circuit lines (e.g., copper circuit lines or copper-plated circuit lines). The metal layer 14 includes metallizations 21, 31, 28, and 29. The metal layer 16 includes metallizations 22, 30, and 32

Definitionally, a single complex power-signal substructure is a multilayered laminate having a complex power-signal (i.e., within an interior portion of the multilayered laminate), and alternating dielectric and metal layers on each of two opposing surfaces of the complex power-signal starting with a first dielectric layer at the power plane surface and ending with a metal layer furthest from the power plane surface.

The single CPS substructure 10 also includes electrically conductive vias 36, 24, and 26. The conductive via 36 is a via that is filled with electrically conductive metal (e.g., copper), and conductively contacts the power plane 12. The conductive via 24 is a through via that has an electrically conductive metal (e.g., copper) plating 27. The space 25 that is interior to the plating 27 may be void, filled with electrically insulative material, or filled with electrically conductive material. The conductive via 24 electrically couples the metallizations 31 and 30, respectively, on the metal layers 14 and 16. The conductive via 26 is a through via that is filled with an electrically conductive metal (e.g., copper), and electrically couples the metallizations 28 and 32, respectively, on the metal layers 14 and 16. The conductive vias 36, 24, and 26 are representative of a variety of conducting vias that may be formed in the single CPS 10. Definitionally, a "conductive via" or a "conducting via" may be either a filled via such as the vias 36 and 26, or a plated via such as the via 24. Any plated via in any of FIGS. 1–8 described herein may be plated with any suitable conductive material as would be known to one of ordinary skill in the art, including, inter alia, plated copper. Any filled via in any of FIGS. 1–8 described herein may be filled with any suitable conductive material as would be known to one of ordinary skill in the art, including, inter alia, copper or screened electrically conductive hole fill material (e.g., electrically conductive silver paste).

The single CPS substructure 10 may be formed by, inter alia, by: providing the metal sheet 18 and forming one or more holes in the metal sheet 18; forming the dielectric layers 13 and 15 on opposite sides of the metal sheet 18; forming the vias 36, 24, and 26 (such as by, inter alia, laser ablation, mechanical drilling, and plasma etch); filling the vias 36 and 26 with electrically conductive metal; forming the plating 27 on sidewalls of the through via 24 followed by filling the via 24 with the electrically insulative material 25; and forming the metal layers 14 and 16 on the dielectric layers 13 and 15, respectively.

FIG. 2 depicts a front cross-sectional view of a double complex power-signal (CPS) substructure 70, in accordance with embodiments of the present invention. The double CPS substructure 70 of FIG. 2 differs from the single CPS substructure 10 of FIG. 1 in that the power plane 12 of FIG. 1 is replaced by the power planes 33 and 35 (with interfacing dielectric layer 34) in FIG. 2. The double CPS substructure 70 may be formed by, inter alia, compressing the dielectric layer 34 between the power planes 33 and 35, followed by the same procedure that was described supra for forming the single CPS substructure 10 of FIG. 1.

The single CPS substructure 10 of FIG. 1 and double CPS substructure 70 of FIG. 2 are each an example of a CPS substructure. Generally a L-CPS substructure has L complex power-signals separated from each other (or from one another) by dielectric layering if $L \geq 2$. The single CPS substructure 10 is a 1-CPS substructure, and the double CPS substructure 70 is a 2-CPS substructure.

After formation of a CPS substructure (e.g., the single CPS substructure 10 or the double CPS substructure 70) and prior to additional processing in which one or more dielectric metallic laminates are formed on the CPS substructure as will be described infra, the CPS substructure is tested as to its electrical performance to determine whether the CPS substructure has passed such tests or testing (i.e., to determine whether the CPS substructure satisfies electrical performance acceptance requirements). Such electrical performance acceptance requirements may be predetermined (i.e., determined in advance prior to the testing). Such electrical performance testing may include testing for at least one of electrical integrity and electrical signal delay. Testing for electrical integrity includes testing for at least one of electrical shorts, electrical opens, and erroneous impedances (i.e., impedances that are outside of tolerance limits of expected impedances, for impedances along selected circuit paths through and/or on the CPS substructure). Testing for electrical signal delay includes measuring a time of flight of a signal passed into the CPS substructure and reflected back, for detecting such faults as an undesired dielectric constant. An advantage of performing such electrical performance testing on the CPS substructure prior to further processing is that such error detection in the CPS substructure involves, at worst, discarding the defective CPS substructure at this early stage in the processing, which reduces costs and improves yields.

If the aforementioned testing determines that the CPS substructure satisfies the electrical performance acceptance requirements, then further processing may proceed as in FIG. 3. If the testing determines, however, that the CPS substructure does not satisfy the electrical performance acceptance requirements (i.e., the CPS substructure is defective), then a new CPS substructure may be formed and such new CPS substructure may replace the defective CPS substructure. Then, the aforementioned testing may be again performed on the CPS substructure so replaced.

In accordance with embodiments of the present invention, FIG. 3 depicts an electrical structure 90, comprising a dielectric-metallic (DM) laminate 40 formed on the single CPS substructure 10 of FIG. 1. In FIG. 3, forming the DM laminate 40 comprises: forming a dielectric layer 41 on an external surface 8 of the CPS substructure 10; forming a metallic layer 42 on the dielectric layer 41; forming a dielectric layer 43 on the metallic layer 42, and forming a terminating metallic layer 44 on the dielectric layer 43. The dielectric layers 41 and 43 may each include a dielectric material such as an organic dielectric material (e.g., polytetrafluoroethylene (PTFE), epoxy-fiberglass, polyimide epoxy, etc.), and the dielectric material in the dielectric layers 41 and 43 may be the same dielectric material or different dielectric materials. The metallic layers 42 and 44 may each include a signal plane or a power plane, made of an electrically conductive metal such as, inter alia, copper. The metallic layer 42 includes a metallization 46. The metallic layer 44 includes metallizations 48, 49, and 59.

Generally, A DM laminate on a CPS substructure includes an alternating sequence of an equal number N of dielectric layers and metallic layers such that a first dielectric layer of the N dielectric layers is formed on an external surface of the CPS substructure, wherein N is at least 2. In FIG. 3, N=2 for the DM laminate 40.

Various conductive blind vias may be formed in the DM laminate 40 as shown. The DM laminate 40 includes a simple blind via ("simple via") 53, deep blind vias ("deep vias") 54, 55, 56, and 57, and a stacked blind via ("stacked via") 58. A simple via is formed by a via-forming operation through one dielectric layer. A deep via is formed by a via-forming operation through two or more dielectric layers. A stacked via passes through two or more layers, but is formed in each such layer individually, one layer at a time. A steep via has smooth sidewalls, while a stacked blind via has discontinuities in sidewall smoothness at layer interfaces, as shown in FIG. 3. Each blind via shown in FIG. 3 may be formed by a method such as, inter alia, laser ablation, mechanical drilling, and plasma etch. While the via 54 has an electrically conductive plating 83 (e.g., copper plating) on its sidewalls with insulative fill 84, the vias 54, 55, 56, 57, and 58 are each filled with conductive material such as copper or screened electrically conductive hole fill material (e.g., electrically conductive silver paste). Generally, a via in the DM laminate 40 may be of the conductively plated type or of the conductively filled type.

Figure 4:
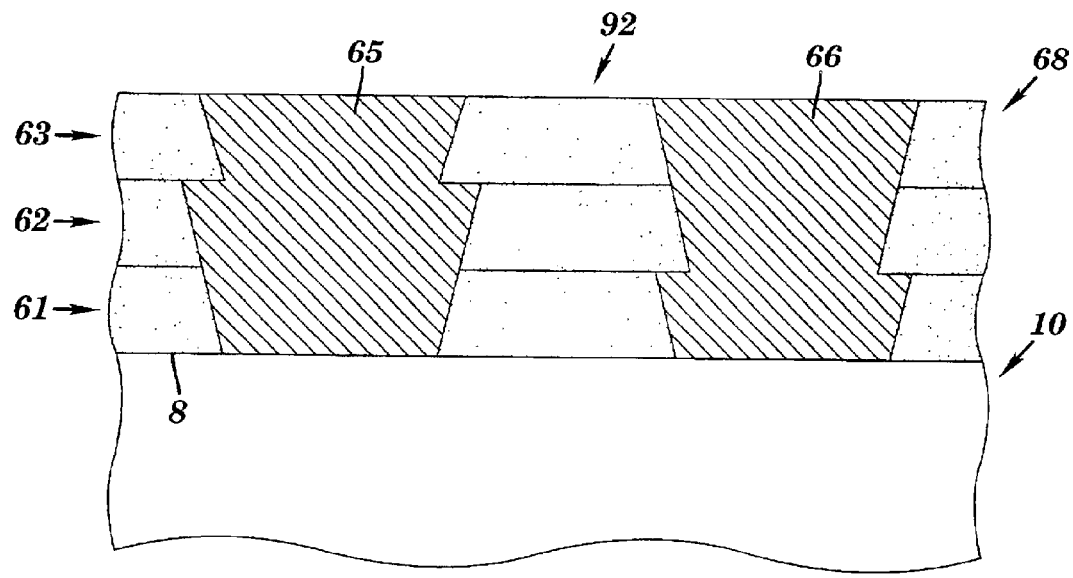
FIG. 4 depicts a portion of the DM laminate of FIG. 3 with added simple-deep vias, in accordance with embodiments of the present invention.
Figure 5:
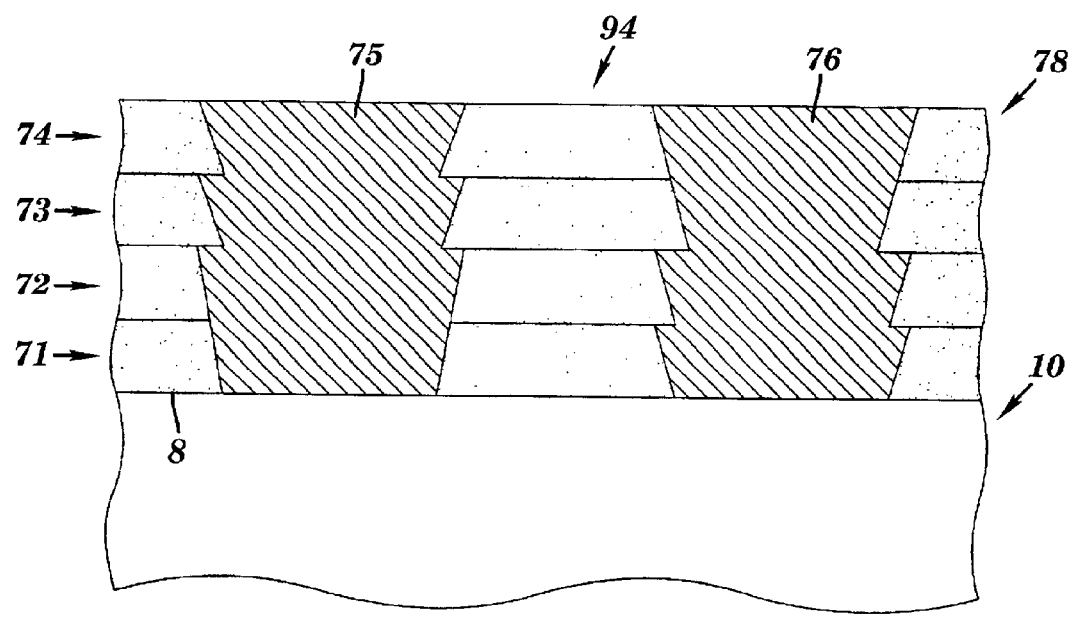
FIG. 5 depicts a portion of the DM laminate of FIG. 3 with added stacked-deep vias, in accordance with embodiments of the present invention.

Variants of steep via, called "simple-deep vias" and "stacked-deep vias", are shown in FIGS. 4 and 5, respectively, in accordance with embodiments of the present invention. FIG. 4 shows an electrical structure 92, comprising a DM laminate 68 formed on the external surface 8 of the CPS substructure 10. The DM laminate 68 has three dielectric layers, namely the dielectric layers 61, 62, and 63, and three metallic layers (not shown for simplicity, but analogous to the metallic layers 42 and 44 in FIG. 3). The DM laminate 68 includes a simple-deep via 65 and a simple-deep via 66. A simple-deep via is a combination of a simple via and a deep via in electrically conductive contact as shown. The simple-deep vias 65 and 66 may each be formed by a method such as, inter alia, laser ablation, mechanical drilling, and plasma etch, of the simple via and deep via components of the simple-deep via.

FIG. 5 shows an electrical structure 94, comprising a DM laminate 78 formed on the external surface 8 of the CPS substructure 10. The DM laminate 78 has four dielectric layers, namely the dielectric layers 71, 72, 73, and 74, and four metallic layers (not shown for simplicity, but analogous to the metallic layers 42 and 44 in FIG. 3). The DM laminate 78 includes a stack-deep via 75 and a stacked-deep via 76. A stacked-deep via is a combination of a stacked via and a deep via in electrically conductive contact as shown. The stacked-deep vias 75 and 76 may each be formed by a method such as, inter alia, laser ablation, mechanical drilling, and plasma etch, of the simple via and deep via components of the simple-deep via.

Definitionally, a "multilevel via" is a conductive via that passes through two or more dielectric layers. Thus a simple via is not a multilevel via, and the following types of vias are multilevel vias: a deep via, a stacked via, a simple-deep via, and a stacked-deep via.

Returning to FIG. 3, the simple via 53 is in electrically conductive contact with the metallization 46 of the metallic layer 42 that is interior to the DM laminate 40. The multilevel vias 54, 55, 56, 57, and 58 each pass through the total thickness of the DM laminate 40 and each is electrically coupled to a metal layer of the CPS substructure 10. In particular, the via 54 is electrically coupled to the metallization 21 at the metal layer 14 of the CPS substructure 10. The via 55 is electrically coupled to the metallization 18 at the power plane 12 of the CPS substructure 10. The via 55 is electrically coupled to the metallization 18 through electrical coupling between the via 55 and the conducting via 36, wherein the conducting via 36 terminates at the metallization 18 and extends through less than the total thickness of the CPS substructure 10. The via 56 is electrically coupled to the metallization 30 at the metal layer 16 of the CPS substructure 10, through electrical coupling between the via 56 and the conducting via 24, wherein the conducting via 24 terminates at the metallization 30 at the surface 9 and extends through the total thickness of the CPS substructure 10. The via 57 is electrically coupled to the metallization 32 at the metal layer 16 of the CPS substructure 10, through electrical coupling between the via 57 and the conducting via 26, wherein the conducting via 26 terminates at the metallization 32 at the surface 9 and extends through the total thickness of the CPS substructure 10. The via 58 is electrically coupled to the metallization 29 at the metal layer 14 of the CPS substructure 10.

Each dielectric layer and adjacent (above) metallic layer of the DM substructure 40 may be formed individually on the electrical structure below, followed by examining (i.e., testing) the electrical performance of the electrical structure 90 formed thus far to determine whether the electrical structure 90 satisfies electrical performance acceptance requirements. Such electrical performance acceptance requirements may be predetermined. Such electrical performance examining may include examining for at least one of electrical integrity and electrical signal delay. Examining for electrical integrity includes examining for at least one of electrical shorts, electrical opens, and erroneous impedances. Examining for electrical signal delay includes measuring a time of flight of a signal passed into the electrical structure 90 and reflected back, for detecting such faults as an undesired dielectric constant. If the examining determines that the electrical structure satisfies the electrical performance acceptance requirements, then the process of forming the DM laminate 40 is continued if less than a maximum of N metallic layers have been formed (N=2 in FIG. 3), but if N metallic layers have been formed then the process of forming the DM laminate ends. If the examining determines, however, that the electrical structure 90 does not pass the electrical performance acceptance requirements, then the process of forming the DM laminate may be discontinued.

The DM laminate 40 on the CPS substructure 10 may represent, inter alia, a chip carrier or a printed circuit board. Accordingly, the electrical structure 90 may also include an electronic assembly 50 (e.g., a semiconductor chip) that is electrically coupled to the DM laminate 40 at the metallization 49 (which may include an electrically conductive pad) by use of a conductive connector 51. The conductive connector 51 may include, inter alia, a controlled collapse chip connection (C4) solder ball. If the DM laminate 40 represents a chip carrier, then the electronic assembly 50 may represent a semiconductor chip. If the DM laminate 40 represents a printed circuit board, the electronic assembly 50 may represent a chip carrier or a semiconductor chip.

Figure 6:
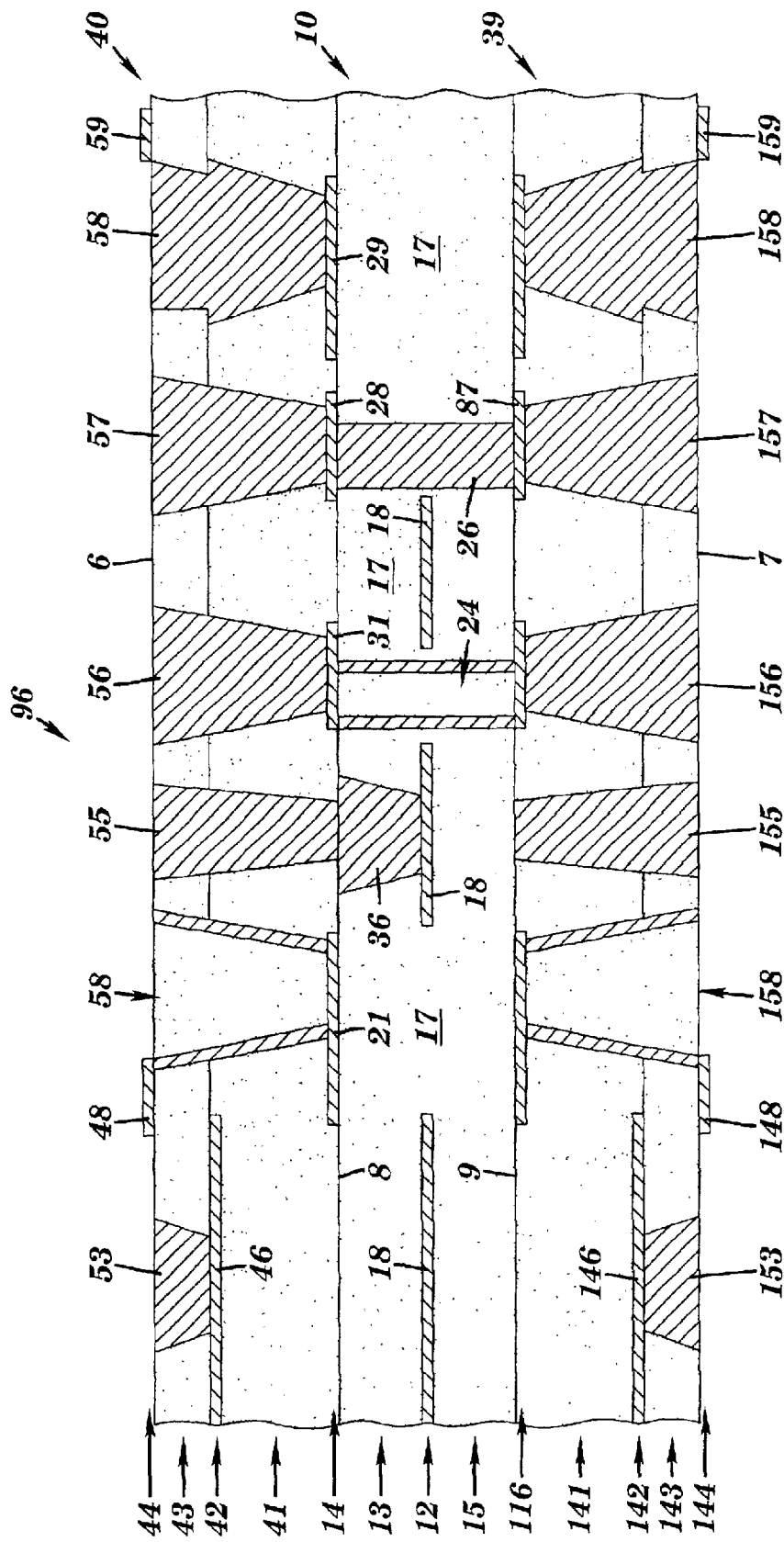
FIG. 6 depicts the CPS substructure of FIG. 1 with a first DM laminate formed on a first surface of the CPS substructure and a second DM laminate formed on a second surface of the CPS substructure, in accordance with embodiments of the present invention.

FIG. 6 depicts an electrical structure 96, based on the electrical structure 90 of FIG. 3 with an added DM laminate 39 formed thereon. In FIG. 6, the electrical structure 96 includes: the DM laminate 40 on the exterior surface 8 of the CPS substructure 10; and the DM laminate 39 on the exterior surface 9 of the CPS substructure 10, wherein the surfaces 8 and 9 are opposite surfaces of the CPS substructure 10. In FIG. 6, a metal layer 116 has replaced the metal layer 16 of FIG. 3. In FIG. 6, the DM laminate 39 has the same properties and characteristics as the DM laminate 40 described supra. Thus in FIG. 6, the DM laminates 39 and 40 have the same structural features and capabilities, the same functionality, and may be subject to the same electrical performance testing.

Generally, the DM laminate 40 may include N dielectric layers, and the DM laminate 39 may include M dielectric layers, wherein M=N and M≠N are each within the scope of the present invention. The DM laminate 39 may be formed on the CPS substructure 10 by the same methods described supra for forming as the DM laminate 40 on the CPS substructure 10. If M=N, then the DM laminate 40 and the DM laminate 39 may be formed symmetrically with respect to the CPS substructure 40; i.e., each dielectric layer (and adjacent metallic layer above) of the DM laminate 40 may be formed concurrent with formation of a corresponding dielectric layer (and adjacent metallic layer above) of the DM laminate 39 in generating the electrical structure 96.

Figure 7:
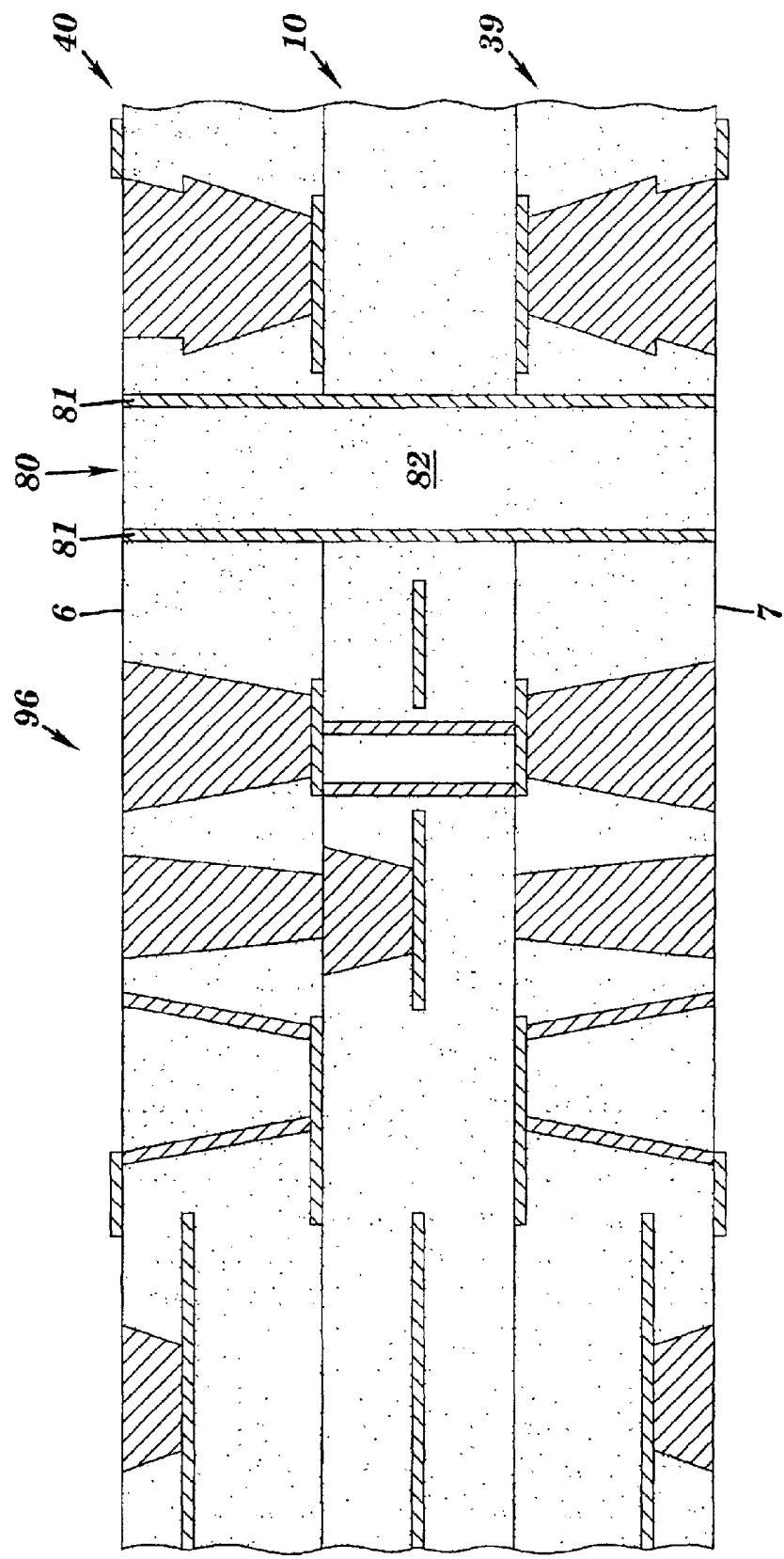
FIG. 7 depicts FIG. 6 with a conductive through hole formed through the first DM laminate, the CPS substructure, and the second DM laminate, in accordance with embodiments of the present invention.

FIG. 7 depicts the electrical structure 96 FIG. 6 with a conductive through hole 80 replacing in FIG. 6: the deep blind via 57 of the DM laminate 40, the conducting via 26 of the CPS substructure 10, the deep blind via 157 of the DM laminate 39, the metallization 28 of the metal layer 14 in the CPS substructure 10, and the metallization 87 of the metal layer 116 in the CPS substructure 10. The conductive through hole 80 passes through the total extent (i.e., thickness) of the electrical structure 96 as shown. Thus, the conductive through hole 80 may be used to electrically couple the exterior surface 6 of the DM laminate 40 with the exterior surface 7 of the DM laminate 39.

Figure 8:
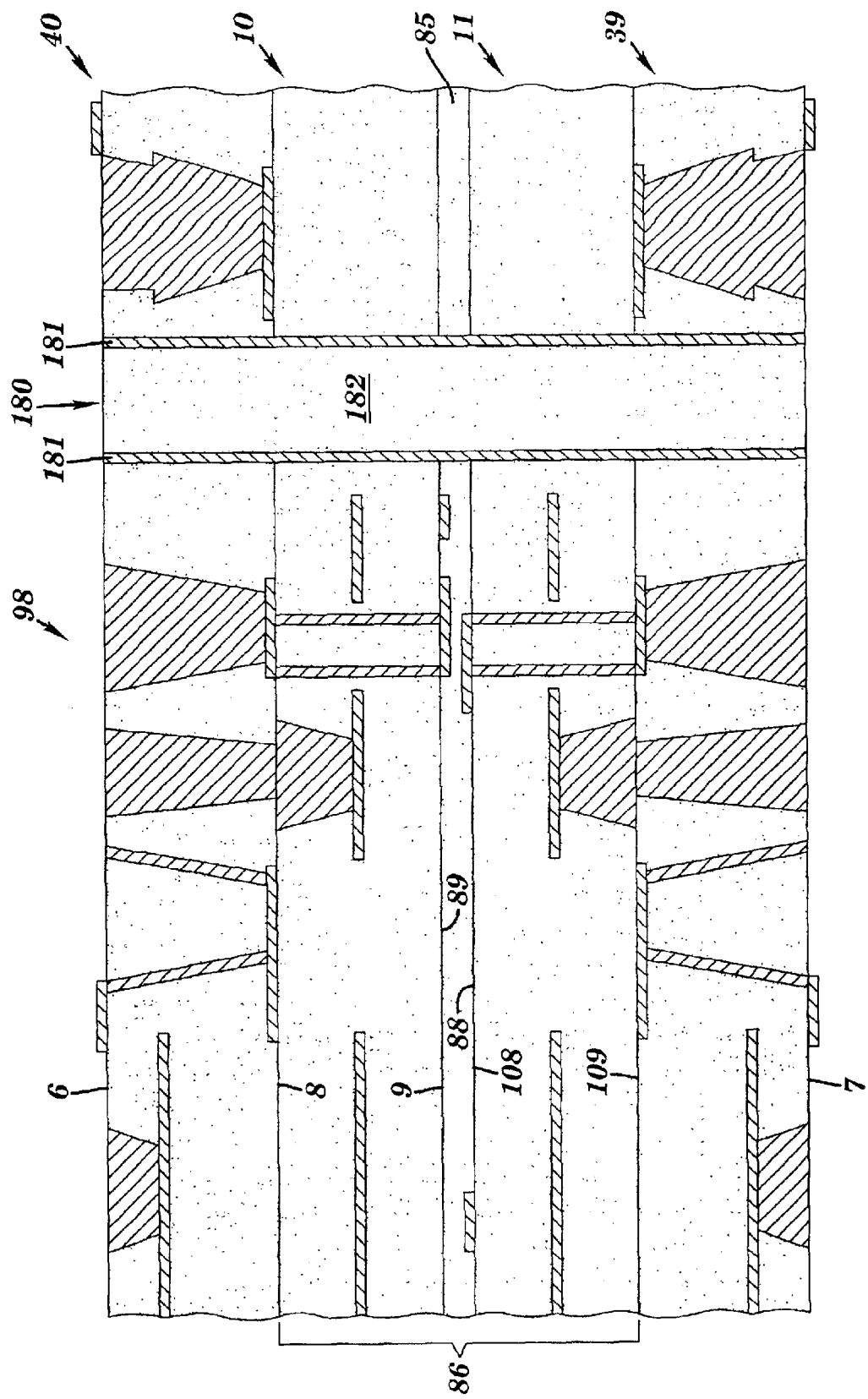
FIG. 8 depicts a first DM laminate and a second DM laminate each coupled to a composite CPS substructure, in accordance with embodiments of the present invention.

FIG. 8 depicts an electrical structure 98, which comprises the electrical structure 96 of FIG. 7 with an added CPS substructure 11 formed between the CPS substructure 10 and the DM laminate 39. In FIG. 8, a composite CPS substructure 86 is formed by coupling (e.g., laminating) the surface 9 of the CPS substructure 10 to a surface 89 of an interfacing dielectric layer 85, and coupling a surface 108 of the CPS substructure 11 to a surface 88 of the interfacing dielectric layer 85. The DM laminate 40 is formed on the CPS substructure 10 as has been described supra. The DM laminate 39 is formed on the CPS substructure 11 in the same manner as the DM laminate 40 is formed on the CPS substructure 10. A conductive through hole 180 in FIG. 8 replaces the conductive through hole 80 in FIG. 7. The conductive through hole 180 in FIG. 8 has the same or analogous functionality as the conductive through hole 80 in FIG. 7. In FIGS. 7 and 8, the DM laminates 39 and 40 have the same structural features and capabilities, the same functionality, may be performed in the same manner, and may be subject to the same electrical performance testing. In FIGS. 7 and 8, the CPS substructures 11 and 10 have the same structural features and capabilities, the same functionality, may be performed in the same manner, and may be subject to the same electrical performance testing. Such electrical performance testing may be independently performed on the CPS substructures 11 and 10.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure, comprising:
    a complex power-signal (CPS) substructure that has passed an electrical performance acceptance test for at least one of an electrical integrity and electrical signal delay, wherein the test for electrical integrity includes a test for at least one of an electrical short, an electrical open, and an erroneous impedance;
    a dielectric-metallic (DM) laminate that includes an alternating sequence of an equal number N of dielectric layers and metallic layers such that a first dielectric layer of the N dielectric layers is formed on a first external surface of the CPS substructure, wherein N is at least 2; and
    a first multilevel conductive via through the DM laminate, wherein the first multilevel conductive via is electrically coupled to a first metal layer of the CPS substructure.

2. The electrical structure of claim 1, wherein the first multilevel conductive via is a stacked via.

3. The electrical structure of claim 1, wherein the first multilevel conductive via is a deep via.

4. The electrical structure of claim 1, wherein the first multilevel conductive via is a simple-deep via.

5. The electrical structure of claim 1, wherein the first multilevel conductive via is a stacked-deep via.

6. The electrical structure of claim 1, wherein the CPS substructure is a single CPS substructure.

7. The electrical structure of claim 1, wherein the CPS substructure is a double CPS substructure.

8. The electrical structure of claim 1, wherein N=2.

9. The electrical structure of claim 1, further comprising a second multilevel conductive via through the DM laminate, wherein the second multilevel conductive via is electrically coupled to a second metal layer of the CPS substructure.

10. The electrical structure of claim 1, wherein the first metal layer is at the first external surface of the CPS substructure.

11. The electrical structure of claim 1, further comprising a conducting via beginning at the first external surface of the CPS substructure and extending through a fraction of a total thickness of the CPS substructure, and wherein the first multilevel conductive via is electrically coupled to the first metal layer of the CPS substructure through the conducting via.

12. The electrical structure of claim 11, wherein the fraction is less than 1, and wherein the first metal layer is within an interior of the CPS substructure.

13. The electrical structure of claim 11, wherein the fraction is less than 1, and wherein the first metal layer is a complex power-signal of the CPS substructure.

14. The electrical structure of claim 11, wherein the fraction is equal to 1 such that the conducting via extends to a second external surface of the CPS substructure, and wherein first metal layer is at the second external surface.

15. The electrical structure of claim 11, wherein the fraction is less than 1, and wherein the first metal layer is a complex power-signal of the CPS substructure.

16. The electrical structure of claim 11, wherein the fraction is equal to 1 such that the conducting via extends to a second external surface of the CPS substructure, and wherein first metal layer is at the second external surface.

17. The electrical structure of claim 11, further comprising a semiconductor chip coupled to a metallic layer of the N metallic layers that is furthest from the CPS substructure.

18. The electrical structure of claim 1, wherein the CPS substructure has passed an electrical performance acceptance test for electrical signal delay.

19. The electrical structure of claim 1, wherein the CPS substructure has passed an electrical performance acceptance test for electrical integrity, and wherein the test for electrical integrity includes a test for an erroneous impedance.

20. An electrical structure, comprising:
    a complex power-signal (CPS) substructure that has satisfied an electrical performance acceptance test for at least one of an electrical integrity and electrical signal delay, and wherein the test for electrical integrity includes a test for at least one of an electrical short, an electrical open, and an erroneous impedance;

a first dielectric-metallic (DM) laminate that includes an alternating sequence of an equal number N of dielectric layers and metallic layers such that a first dielectric layer of the N dielectric layers is formed on a first external surface of the CPS substructure, wherein N is at least 2, and wherein a first multilevel conductive via through the first DM laminate is electrically coupled to a first metal layer of the CPS substructure; and a second dielectric-metallic (DM) laminate that includes an alternating sequence of an equal number M of dielectric layers and metallic layers such that a first dielectric layer of the M dielectric layers is formed on a second external surface of the CPS substructure, wherein M is at least 2, and wherein a second multilevel conductive via through the second DM laminate is electrically coupled to a second metal layer of the CPS substructure.

21. The electrical structure of claim 20, wherein M=N.

22. The electrical structure of claim 20, further comprising a conductive through hole through a total thickness of the electrical structure, including through the first DM laminate, the CPS substructure, and the second DM laminate.

23. An electrical structure, comprising:

a composite complex power-signal (CPS) substructure that includes an interfacing dielectric layer sandwiched between a first CPS substructure and a second CPS substructure, wherein a first surface of the first CPS substructure is coupled to a first surface of the interfacing dielectric layer, and wherein a first surface of the second CPS substructure is coupled to a second surface of the interfacing dielectric layer, said first CPS substructure having passed an electrical performance acceptance test for at least one of an electrical integrity and electrical signal delay, and wherein the test for electrical integrity includes a test for at least one of an electrical short, an electrical open, and an erroneous impedance, and said second CPS substructure having passed the electrical performance acceptance test for at least one of an electrical integrity and electrical signal delay, and wherein the test for electrical integrity includes a test for at least one of an electrical short, an electrical open, and an erroneous impedance, a first dielectric-metallic (DM) laminate that includes an alternating sequence of an equal number N of dielectric layers and metallic layers such that a first dielectric layer of the N dielectric layers is formed on a second surface of the first CPS substructure, wherein N is at least 2, and wherein a first multilevel conductive via through the first DM laminate is electrically coupled to a metal layer of the first CPS substructure; and a second DM laminate that includes an alternating sequence of an equal number M of dielectric layers and metallic layers such that a first dielectric layer of the M dielectric layers is formed on a second surface of the second CPS substructure, wherein M is at least 2, and wherein a second multilevel conductive via through the second DM laminate is electrically coupled to a metal layer of the second CPS substructure.

24. The electrical structure of claim 23, wherein M=N.

25. The electrical structure of claim 23, further a conductive through hole through a total thickness of the electrical structure, including through the first DM laminate, the composite CPS substructure, and the second DM laminate.

26. An electrical structure, comprising:

a complex power-signal (CPS) substructure that has passed an electrical performance acceptance test for at least one of an electrical integrity and electrical signal delay, and wherein the test for electrical integrity includes a test for at least one of an electrical short, an electrical open, and an erroneous impedance;

a dielectric-metallic (DM) laminate that includes an alternating sequence of an equal number N of dielectric layers and metallic layers such that a first dielectric layer of the N dielectric layers is formed on a first external surface of the CPS substructure, wherein N is at least 2;

a first multilevel conductive via through the DM laminate, wherein the first multilevel conductive via is electrically coupled to a first metal layer of the CPS substructure; and a semiconductor chip coupled to a metallic layer of the N metallic layers that is furthest from the CPS substructure.

27. An electrical structure, comprising:

a complex power-signal (CPS) substructure that has passed an electrical performance acceptance test for at least one of an electrical integrity and electrical signal delay, and wherein the test for electrical integrity includes a test for at least one of an electrical short, an electrical open, and erroneous an impedance;

a first dielectric-metallic (DM) laminate that includes an alternating sequence of an equal number N of dielectric layers and metallic layers such that a first dielectric layer of the N dielectric layers is formed on a first external surface of the CPS substructure, wherein N is at least 2, and wherein a first multilevel conductive via through the first DM laminate is electrically coupled to a first metal layer of the CPS substructure;

a second dielectric-metallic (DM) laminate that includes an alternating sequence of an equal number M of dielectric layers and metallic layers such that a first dielectric layer of the M dielectric layers is formed on a second external surface of the CPS substructure, wherein M is at least 2, and wherein a second multilevel conductive via through the second DM laminate is electrically coupled to a second metal layer of the CPS substructure; and a semiconductor chip coupled to a metallic layer of the N metallic layers that is furthest from the CPS substructure.

28. An electrical structure, comprising:

a composite complex power-signal (CPS) substructure that includes an interfacing dielectric layer sandwiched between a first CPS substructure and a second CPS substructure, wherein a first surface of the first CPS substructure is coupled to a first surface of the interfacing dielectric layer, and wherein a first surface of the second CPS substructure is coupled to a second surface of the interfacing dielectric layer, said first CPS substructure having passed an electrical performance acceptance test for at least one of an electrical integrity and electrical signal delay, and wherein the test for electrical integrity includes a test for at least one of an electrical short, electrical open, and erroneous impedance, and said second CPS substructure having passed the electrical performance acceptance test for at least one of an electrical integrity and electrical signal delay, and wherein the test for electrical integrity includes a test for at least one of an electrical short, an electrical open, and an erroneous impedance, a first dielectric-metallic (DM) laminate that includes an alternating sequence of an equal number N of dielectric layers and metallic layers such that a first dielectric layer of the N dielectric layers is formed on a second surface of the first CPS substructure, wherein N is at least 2, and wherein a first multilevel conductive via through the first DM laminate is electrically coupled to a metal layer of the first CPS substructure;

a second DM laminate that includes an alternating sequence of an equal number M of dielectric layers and metallic layers such that a first dielectric layer of the M dielectric layers is formed on a second surface of the second CPS substructure, wherein M is at least 2, and wherein a second multilevel conductive via through the second DM laminate is electrically coupled to a metal layer of the second CPS substructure; and a semiconductor chip coupled to a metallic layer of the N metallic layers that is furthest from the first CPS substructure.

29. An electrical structure, comprising:

a complex power-signal (CPS) substructure;

a dielectric-metallic (DM) laminate that includes an alternating sequence of an equal number N of dielectric layers and metallic layers such that a first dielectric layer of the N dielectric layers is formed on a first external surface of the CPS substructure, wherein N is at least 2; and a first multilevel conductive via through the DM laminate, wherein the first multilevel conductive via is electrically coupled to a first metal layer of the CPS substructure.

30. The electrical structure of claim 29, wherein the first multilevel conductive via is a stacked via.

31. The electrical structure of claim 29, wherein the first multilevel conductive via is a deep via.

32. The electrical structure of claim 29, wherein the first multilevel conductive via is a simple-deep via.

33. The electrical structure of claim 29, wherein the first multilevel conductive via is a stacked-deep via.

34. The electrical structure of claim 29, wherein the CPS substructure is a single CPS substructure.

35. The electrical structure of claim 29, wherein the CPS substructure is a double CPS substructure.

36. The electrical structure of claim 29, wherein N=2.

37. The electrical structure of claim 29, further comprising a second multilevel conductive via through the DM laminate, wherein the second multilevel conductive via is electrically coupled to a second metal layer of the CPS substructure.

38. The electrical structure of claim 29, wherein the first metal layer is at the first external surface of the CPS substructure.

39. The electrical structure of claim 29, further comprising a conducting via beginning at the first external surface of the CPS substructure and extending through a fraction of a total thickness of the CPS substructure, and wherein the first multilevel conductive via is electrically coupled to the first metal layer of the CPS substructure through the conducting via.

40. The electrical structure of claim 29, wherein the fraction is less than 1, and wherein the first metal layer is within an interior of the CPS substructure.

\* \* \* \* \*